United States Patent
Chang et al.

(10) Patent No.: US 9,142,672 B2
(45) Date of Patent: Sep. 22, 2015

(54) STRAINED SOURCE AND DRAIN (SSD) STRUCTURE AND METHOD FOR FORMING THE SAME

(71) Applicant: Taiwan Semiconductor Manufacturing Co., Ltd, Hsin-Chu (TW)

(72) Inventors: Che-Cheng Chang, New Taipei (TW); Tung-Wen Cheng, Hsinchu (TW); Yi-Jen Chen, Hsinchu (TW); Yung-Jung Chang, Cyonglin Township (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 46 days.

(21) Appl. No.: 14/023,012

(22) Filed: Sep. 10, 2013

(65) Prior Publication Data

US 2015/0069466 A1   Mar. 12, 2015

(51) Int. Cl.
*H01L 29/78* (2006.01)
*H01L 29/08* (2006.01)
*H01L 29/36* (2006.01)
*H01L 29/06* (2006.01)

(52) U.S. Cl.
CPC ........ *H01L 29/7848* (2013.01); *H01L 29/0603* (2013.01); *H01L 29/0847* (2013.01); *H01L 29/36* (2013.01)

(58) Field of Classification Search
CPC . H01L 29/36; H01L 29/7848; H01L 29/0847; H01L 29/165; H01L 29/66636
USPC ........... 257/192, 285, 336, 371, 408, E29.242
See application file for complete search history.

(56) References Cited

U.S. PATENT DOCUMENTS

2012/0181625 A1* 7/2012 Kwok et al. .................. 257/408

* cited by examiner

*Primary Examiner* — Andy Huynh
(74) *Attorney, Agent, or Firm* — Birch, Stewart, Kolasch & Birch, LLP

(57) ABSTRACT

Embodiments of mechanisms of forming a semiconductor device structure are provided. The semiconductor device structure includes a substrate and a gate stack structure formed on the substrate. The semiconductor device structure also includes gate spacers formed on sidewalls of the gate stacks. The semiconductor device structure includes doped regions formed in the substrate. The semiconductor device structure also includes a strained source and drain (SSD) structure adjacent to the gate spacers, and the doped regions are adjacent to the SSD structure. The semiconductor device structure includes SSD structure has a tip which is closest to the doped region, and the tip is substantially aligned with an inner side of gate spacers.

20 Claims, 6 Drawing Sheets

STRAINED SOURCE AND DRAIN (SSD) STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

A MOSFET with stressor regions is often formed by using epitaxially grown semiconductor materials to form source and drain features. Various techniques directed at the shapes, configurations, and materials of the source and drain features have been implemented to further improve transistor device performance. Although existing approaches have been generally adequate for their intended purposes, they have not been entirely satisfactory in all respects.

BRIEF DESCRIPTION OF THE DRAWING

For a more complete understanding of the present disclosure, and the advantages, reference is now made to the following descriptions taken in conjunction with the accompanying drawings, in which.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements.

Figure 1A:
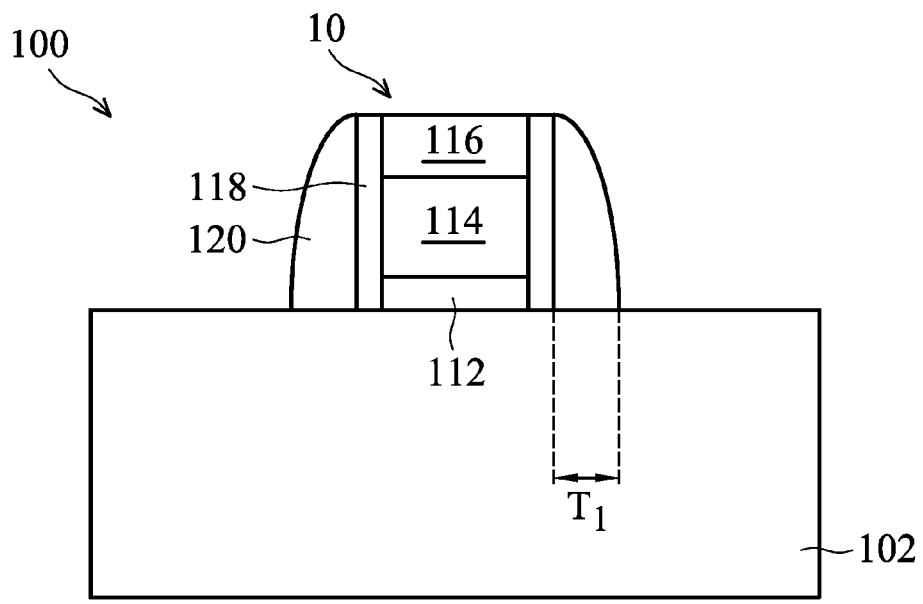
FIGS. 1A-1D show cross-sectional representations of various stages of forming a semiconductor device, in accordance with some embodiments of the disclosure.

Mechanisms for forming a semiconductor device are provided. FIGS. 1A-1D show cross-sectional representations of various stages of forming a semiconductor device 100 in accordance with some embodiments of the disclosure. Referring to FIG. 1A, semiconductor device 100 is provided. Semiconductor device 100 includes a semiconductor substrate 102 and a gate stack structure 10 formed on semiconductor substrate 102.

Semiconductor substrate 102 may be made of silicon or other semiconductor materials. Alternatively or additionally, semiconductor substrate 102 may include other elementary semiconductor materials such as germanium. In some embodiments, semiconductor substrate 102 is made of a compound semiconductor such as silicon carbide, gallium arsenic, indium arsenide, or indium phosphide. In some embodiments, semiconductor substrate 102 is made of an alloy semiconductor such as silicon germanium, silicon germanium carbide, gallium arsenic phosphide, or gallium indium phosphide. In some embodiments, semiconductor substrate 102 includes an epitaxial layer. For example, semiconductor substrate 102 has an epitaxial layer overlying a bulk semiconductor.

Semiconductor substrate 102 may further include isolation features (not shown), such as shallow trench isolation (STI) features or local oxidation of silicon (LOCOS) features. The isolation features may define and isolate various integrated circuit devices. Integrated circuit devices, such as metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements, are formed in and/or on semiconductor substrate 102.

Gate stack structure 10 includes a gate dielectric layer 112, a gate electrode layer 114 and a mask layer 116 in some embodiments. Gate dielectric layer 112 is formed on substrate 102. Gate dielectric layer 112 may be made of silicon oxide, silicon oxynitride, or a high dielectric constant material (high-k material). The high dielectric constant material may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or other suitable high-k dielectric materials. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or other suitable materials. Gate dielectric layer 112 may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, or other suitable processes.

Afterwards, gate electrode layer 114, such as polysilicon, metal or metal silicide, is formed on the gate dielectric layer 112. In some embodiments, gate electrode layer 114 is made of a polysilicon layer which serves as a dummy gate that is replaced in a subsequent gate replacement process. In some embodiments, gate electrode layer 114 is formed by using a CVD process.

As shown in FIG. 1A, mask layer 116, such as a hard mask layer, is formed on gate electrode layer 114. After forming mask layer 116, gate dielectric layer 112 and gate electrode layer 114 are then patterned, for example, by using a photolithography process and an etching process such that gate stack structure 10 is formed. Gate stack structure 10 may include a number other layers, for example, capping layers, interface layers, diffusion layers, barrier layers.

Afterwards, sealing layers 118 are formed on sidewalls of the gate stack structure 10. However, sealing layers 118 are optional. Sealing layers 118 are made of a dielectric material. The dielectric material may include, for example, a silicon nitride, silicon oxide, silicon oxynitride, or other suitable materials. Sealing layers 118 are deposited on the gate stack structures 10 and the semiconductor substrate 102 by using a suitable process, such as a CVD process. Then, an etching process, such as a dry etching process, is performed to partially remove the sealing layers 118 such that the sealing layers 118 remain on the opposite sidewalls of the gate stack structure 10. The sealing layers 118 may protect the gate stack structure 10 from damage when subsequent process steps are performed. In some embodiments, sealing layers 118 have a thickness in a range from about 1 nm to about 5 nm.

As shown in FIG. 1A, gate spacers 120 are formed on the opposite sidewalls of the gate stack structure 10 to cover sealing layer 118. In some embodiments, a dielectric layer is deposited over semiconductor substrate 102, and an etching process is performed to remove a portion of the dielectric layer to form gate spacers 120. Gate spacers 120 are made of silicon oxide, silicon nitride, silicon oxynitride, and/or dielectric materials. Gate spacers 120 may include one layer or multiple layers. In some embodiments, gate spacers 120 have a thickness $T_1$ in a range from about 9 nm to about 17 nm.

Figure 1B:
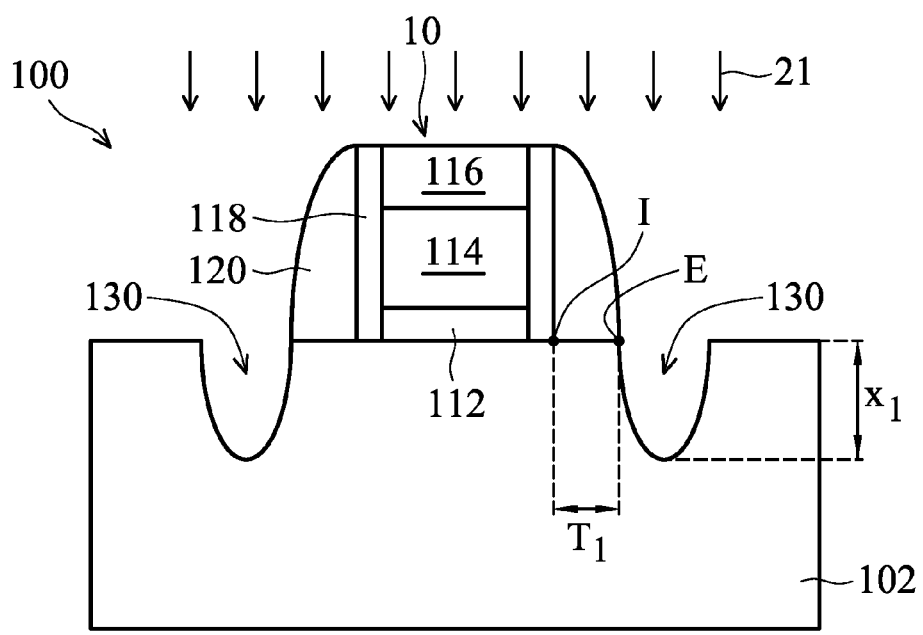

After forming gate spacers 120, a dry etching process 21 is performed to remove a portion of semiconductor substrate 102 and to form recesses 130 as shown in FIG. 1B in accordance with some embodiments of the disclosure. In some embodiments, recesses 130 are aligned with gate spacers 120.

In some embodiments, dry etching process 21 includes an etching gas including He, Ar, HBr, $N_2$, $CH_4$, $CF_4$, $CH_3F$, $CH_2F_2$, $CHF_3$ and $O_2$. In some embodiments, recesses 130 have a depth $X_1$ in a range from about 57 nm to about 66 nm.

Gate spacer 120 includes an inner side I closer to gate stack structure 10. Recesses 130 include an inner edge E closer to gate stack structure 10. A surface proximity is defined by a distance on a top surface of semiconductor substrate 102 between an inner side I of gate spacers 120 and an inner edge E of recess 130 (or when the recesses are filled, a source and drain structure). It should be noted that an etching profile of recesses 130 is limited by thickness $T_1$ of gate spacers 120. For example, as shown in FIG. 1B, the etching profile of recesses 130 achieves a surface proximity from I to E is about thickness $T_1$ of gate spacers 120. In some embodiments, a surface proximity from I to E is in a range from about 15 nm to about 21 nm.

Figure 1C:
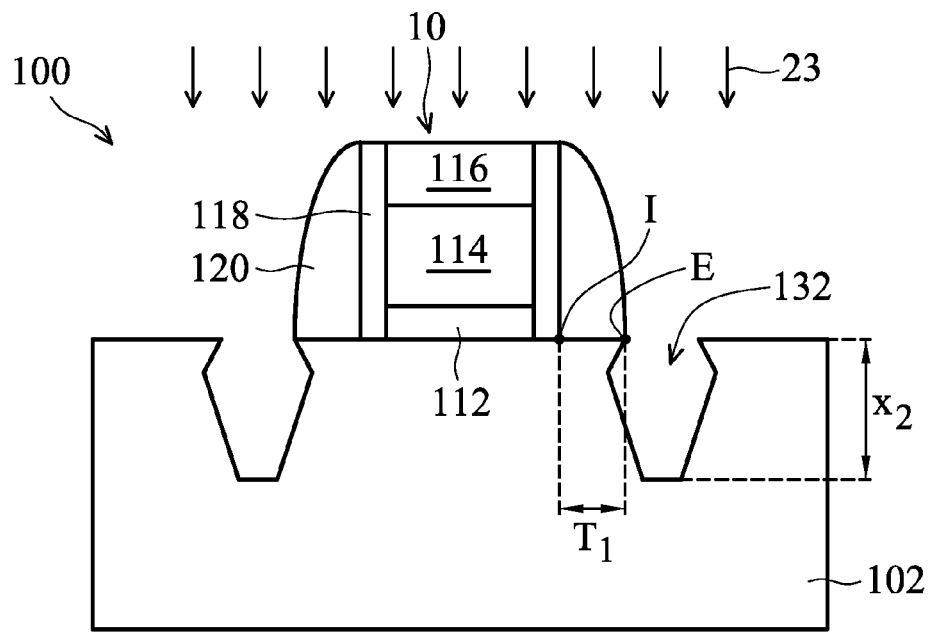

Afterwards, a wet etch process 23 is performed to enlarge the recesses 130 to form an enlarged recesses 132 as shown in FIG. 1C in accordance with some embodiments of the disclosure. In some embodiments, enlarged recesses 132 are aligned with gate spacers 120.

It should be noted that an etching profile of enlarged recesses 132 is still limited by thickness $T_1$ of gate spacers 120. For example, as shown in FIG. 1C, the etching profile of enlarged recesses 132 achieves a surface proximity from I to E is about thickness $T_1$ of gate spacers 120. In some embodiments, a surface proximity from I to E is in a range from about 15 nm to about 21 nm.

In some embodiments, wet etching process 23 includes an etching solution including $NH_4OH$, KOH (potassium hydroxide), HF (hydrofluoric acid), TMAH (tetramethyl ammonium hydroxide), or other applicable etching solutions. In some embodiments, enlarged recesses 132 have a depth $X_2$ in a range from about 10 nm to about 20 nm.

Afterwards, a semiconductor material is formed in enlarged recesses 132 to form a strained source and drain (SSD) structure 140. In some embodiments, silicon germanium (SiGe) is deposited in the recesses 132 of semiconductor substrate 102 to form SiGe source and drain structure 140. Strained source and drain structure 140 may alternatively be referred to as raised source and drain regions. Strained source and drain structure 140 associated with gate stack structure 10 may be in-situ doped or undoped during the epi process. When strained source and drain structure 140 are undoped, they may be doped in a subsequent process. The doping may be achieved by an ion implantation process, plasma immersion ion implantation (PIII) process, gas and/or solid source diffusion process, or other suitable process. Strained source and drain structure 140 may further be exposed to annealing processes, such as a rapid thermal annealing process.

Figure 1D:
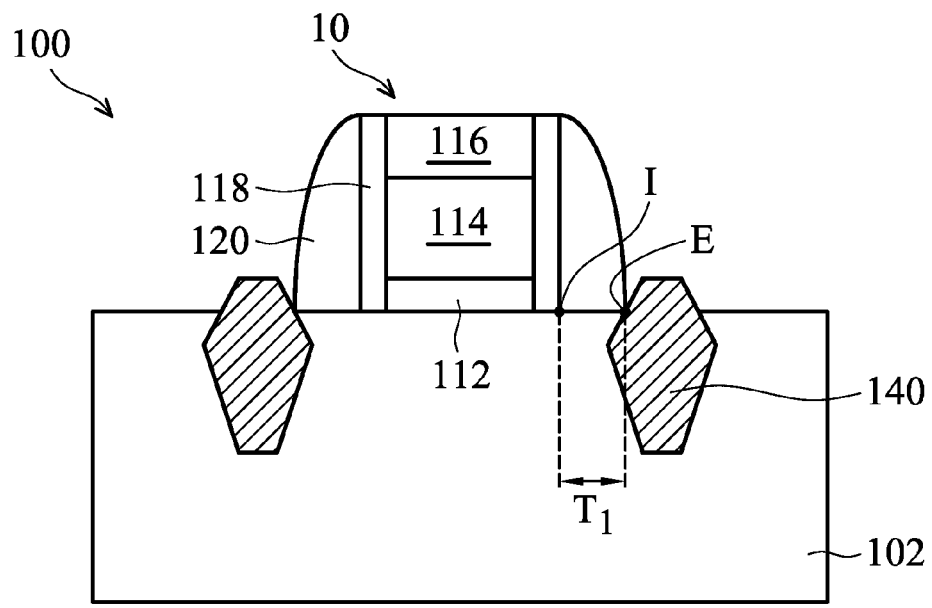

In some embodiments, strained source and drain structure 140 is formed by an epitaxy or epitaxial (epi) process. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, or other suitable epi processes. The epi process may use gaseous and/or liquid precursors, which may interact with the composition of semiconductor substrate 102. The deposited semiconductor material is different from semiconductor substrate 102. Accordingly, a channel region of semiconductor device 100 is strained or stressed to enable carrier mobility of a device and enhance device performance. However, as shown in FIG. 1D, a surface proximity from I to E of strained source and drain structure 140 is limited by thickness $T_1$ of gate spacers 120. Therefore, if the surface proximity is further reduced, the performance of the semiconductor device will be improved.

FIGS. 2A-2G show cross-sectional representations of various stages of forming a semiconductor device 100 in accordance with some embodiments of the disclosure. FIGS. 2A-2G show a fabricating method used in a gate-last process. However, the embodiments of the disclosure may also be used in a gate-first process.

Figure 2A:
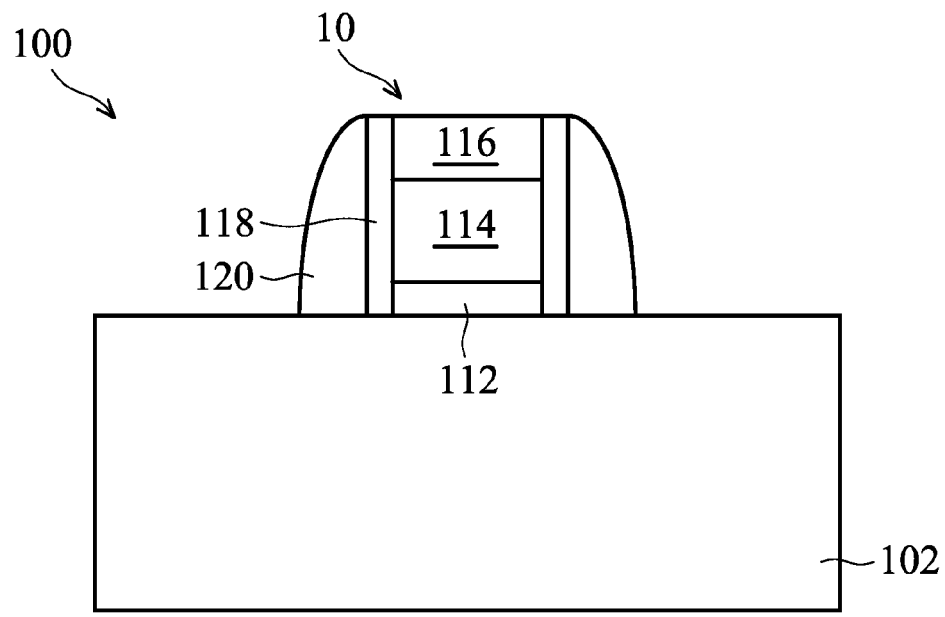
FIGS. 2A-2G shows a cross-sectional representation of various stages of forming a semiconductor device, in accordance with some embodiments of the disclosure.

As shown in FIG. 2A, gate stack structure 10 is formed over semiconductor substrate 102. Gate stack structure 10 includes gate dielectric layer 112, gate electrode layer 114 and mask layer 116. Afterwards, sealing layer 118 and gate spacers 120 are formed on sidewalls of gate stack structure 10.

Figure 2B:
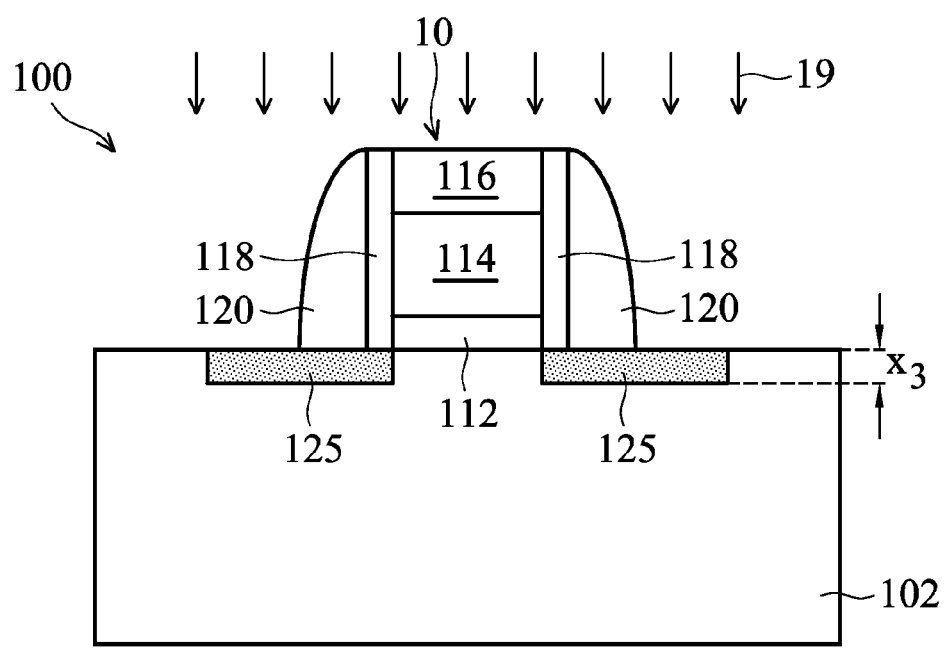

After forming gate spacers 120, doped regions 125 are formed in semiconductor substrate 102 as shown in FIG. 2B in accordance with some embodiments of the disclosure. Doped regions 125 are aligned with the sidewalls of gate stack structure 10. As shown in FIG. 2B, doped regions 125 are aligned with an inner side of sealing layers 118. In some embodiments, doped regions 125 are doped with an n-type dopant, such as arsenic (As), phosphorous (P) or antimony (Sb). In some other embodiments, doped regions 125 are doped with a p-type dopant, such as boron (B) or boron fluorine ($BF_2$). In some embodiments, doped regions 125 are doped with arsenic (As) having a concentration in a range from about 1E13 to about 2E18 atom/$cm^2$. Doped regions 125 have a gradient dopant concentration, and dopant concentration is decreased from inner side to outer side of doped regions 125.

In some embodiments, an ion implantation (IMP) process 19 is performed to form doped regions 125. In some embodiments, ion implantation (IMP) process 19 is operated under a power in a range from about 1 KeV to about 20 keV. In some embodiments, doped regions 125 extend from a surface of semiconductor substrate 102 to a depth $X_3$ in a range from about 1 A to about 100 A.

Figure 2C:
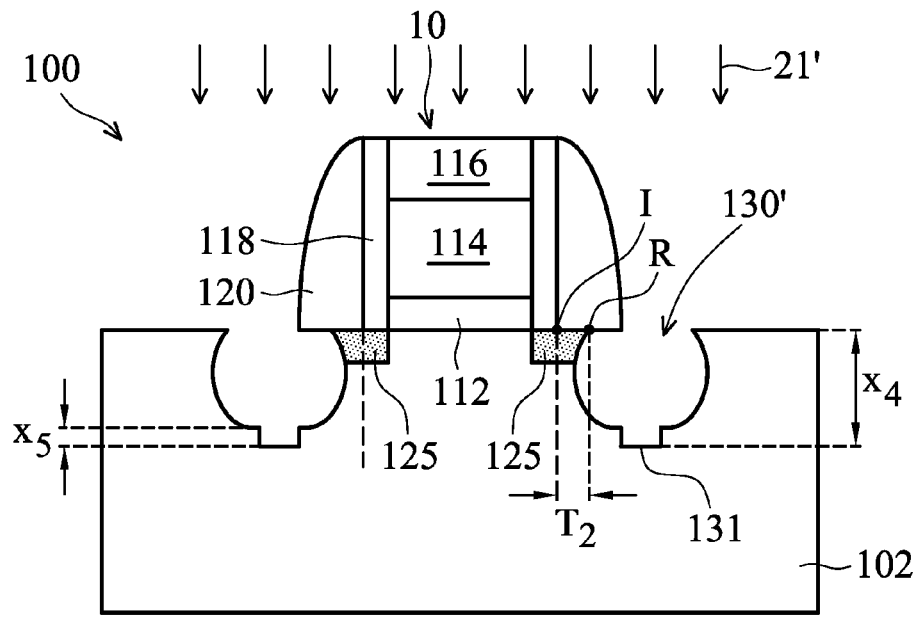

Afterwards, dry etching process 21 is performed to remove a portion of semiconductor substrate 102 and to form recesses 130' as shown in FIG. 2C in accordance with some embodiments of the disclosure. In some embodiments, dry etching process 21' includes a plasma etching process.

In some embodiments, an etching gas used in dry etching process 21' includes helium (He), argon (Ar), chlorine ($Cl_2$), oxygen ($O_2$), HBr, N2, CF4 and CH3F. In some embodiments, chlorine ($Cl_2$) to helium (He) has a ratio in a range from about 0.1 to about 10.

In some embodiments, an etching pressure used in dry etching process 21' is in a range from about 1 mT to about 50 mT. In some embodiments, an etching source power used in dry etching process 21' is in a range from about 100 W to about 2000 W. In some embodiments, an RF bias voltage used in dry etching process 21' is in a range from about 0 V to about 600 V.

As mentioned above, dopant, such as arsenic (As) is doped in semiconductor substrate 102 to form doped region 125. In addition, chlorine ($Cl_2$) is a main etching gas used in etching process 21'. In the undoped region, the substrate and chlorine atoms react to form a covalent bond (such Si—Cl bond) which is hard to be broken. In contrast, in doped region 125, doped arsenic (As) atoms in doped region 125 induce charge unbalances in semiconductor substrate 102, and the bonding of the Si–Cl bond may be broken due to the unbalanced charge. Therefore, extra chlorine atoms formed by breaking the Si–Cl bond may attack or etch semiconductor substrate 102. In other words, doped regions 125 are etched by the extra chlorine atoms. Accordingly, the doped region 125 under gate spacers 120 is etched by dry etching process 21'. In some embodiments, an etching rate of dry etching process 21' is increased with an increase in the doping concentration of doped regions 125.

Gate spacer 120 includes an inner side I closer to gate stack structure 10. Recesses 130' include an inner border R closer to gate stack structure 10. It should be noted that border R of recesses 130' on the top surface of semiconductor substrate 102 is not aligned with an outer side of gate spacer 120. A surface proximity is defined by a distance on a top surface of semiconductor substrate 102 between an inner side I of gate spacers 120 and an inner border R of recess 130'. In some embodiments, the etching profile of the recesses 130' achieve a surface proximity $T_2$ from I to R is in a range from about 0 to about 5 nm.

As shown in FIG. 2C, recesses 130' have a rounded shape. In some embodiments, recesses 130' have a depth $X_4$ in a range from about 14 nm to about 19 nm. In addition, recesses 130' have a protruding portion 131. Protruding portion 131 is a cuboid with a rectangular bottom surface and an inclined sidewall. In some embodiments, protruding portion 131 has a depth $X_5$ in a range from about 3 nm to about 7 nm.

Figure 2D:
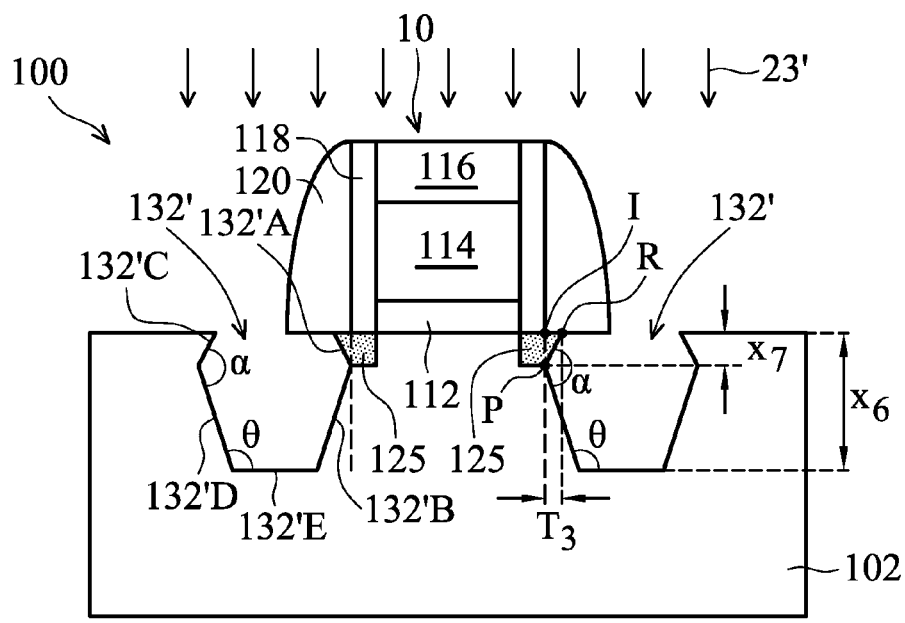

Afterwards, a wet etch process 23' is performed to enlarge the recesses 130' to form an enlarged recesses 132' as shown in FIG. 2D in accordance with some embodiments of the disclosure. It should be noted that border R of enlarged recesses 132' on the top surface of semiconductor substrate 102 is not aligned with an outer side of gate spacer 120. In addition, border R of enlarged recesses 132' is closer to gate stack structure 10 than border R of recesses 130'. As shown in FIG. 2D, the etching of enlarged recesses 132' achieves a surface proximity $T_3$ from I to R is in a range from about −1 nm to about +1 nm.

In some embodiments, wet etching process 23' includes an etching solution including TMAH (tetramethyl ammonium hydroxide), $NH_4OH$, KOH (potassium hydroxide), HF (hydrofluoric acid), or other applicable etching solutions. In some embodiments, TMAH used in wet etching process 23' has a concentration in a range from about 1% to about 10%.

In some embodiments, the etching profile of enlarged recesses 132' is defined by facets 132'A, 132'B, 132'C, 132'D, and 132'E of semiconductor substrate 102. Facets 132'A, 132'B, 132'C, and 132'D, are referred to as shallow facets, and facet 132'E is referred to as a bottom facet. In some embodiments, the etching profile of the recess is defined by 132'A, 132'B, 132'C, and 132'D in a {111} crystallographic plane of semiconductor substrate 102, and facet 132'E in a {100} crystallographic plane of semiconductor substrate 102. In some embodiments, an angle α between shallow facets 132'A and 132'B of semiconductor substrate 102 is in a range from 115 degree to about 135 degree. In some embodiments, an angle θ between facet 132'B and 132'E is in a range from 115 degree to about 125 degree. In some embodiments, enlarged recesses' 132 have a depth $X_6$ in a range from about 37 nm to about 43 nm.

A tip depth defines a distance between a top surface of semiconductor substrate 102 and an intersection P of facets 132'A and 132'B (or facets 132'C and 132'D). In some embodiments, the etching profile of enlarged recesses 132' achieves a tip depth $X_7$ in a range from about 5 nm to about 8 nm. In some embodiments, an intersection P of facets 132'A and 132'B (or facets 132'C and 132'D) is almost aligned with inner side I of gate spacers 120.

Figure 2E:
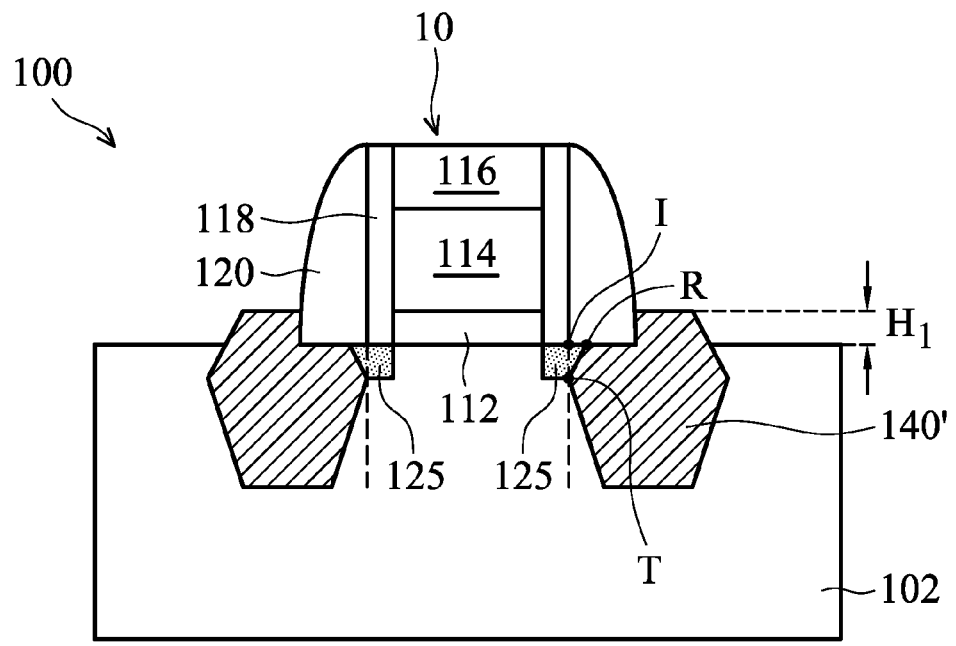

After forming enlarged recesses 132', a semiconductor material is formed in enlarged recesses 132' to form a strained source and drain (SSD) structure 140' as shown in FIG. 2E in accordance with some embodiments of the disclosure. In some embodiments, silicon germanium (SiGe) is deposited in enlarged recesses' 132 of semiconductor substrate 102 to form SiGe SSD structure 140'. In some embodiments, SSD structure 140' has tip T which is closest to doped region 125, and tip T is substantially aligned with an inner side of gate spacers 120.

It should be noted that border R of strained source and drain (SSD) structure 140' on the top surface of semiconductor substrate 102 is not aligned with an outer side of gate spacer 120. In addition, since enlarged recesses 132' achieve a small surface proximity $T_3$, SSD structure 140' has a small surface proximity $T_3$ from I to R. In some embodiments, the profile of SSD structure 140' achieves a surface proximity $T_3$ from I to R is in a range from about −1 nm to about +1 nm. Compared to SSD structure 140 shown in FIG. 1D, SSD structure 140' shown in FIG. 2E has a relatively smaller surface proximity. Therefore, a channel length of semiconductor device 100 is reduced by shortening the surface proximity.

As shown in FIG. 2E, SSD structure 140' has a raised height $H_1$ over the top surface of semiconductor substrate 102. In some embodiment, raised height $H_1$ is in a range from about 16 to about 20 nm. If raised height $H_1$ is too large, gate spacers 120 may collapse due to compressive stress induced from SSD structure 140'. If raised height $H_1$ is too small, a contact landing window will be impacted to induce circuits open and yield loss.

Figure 2F:
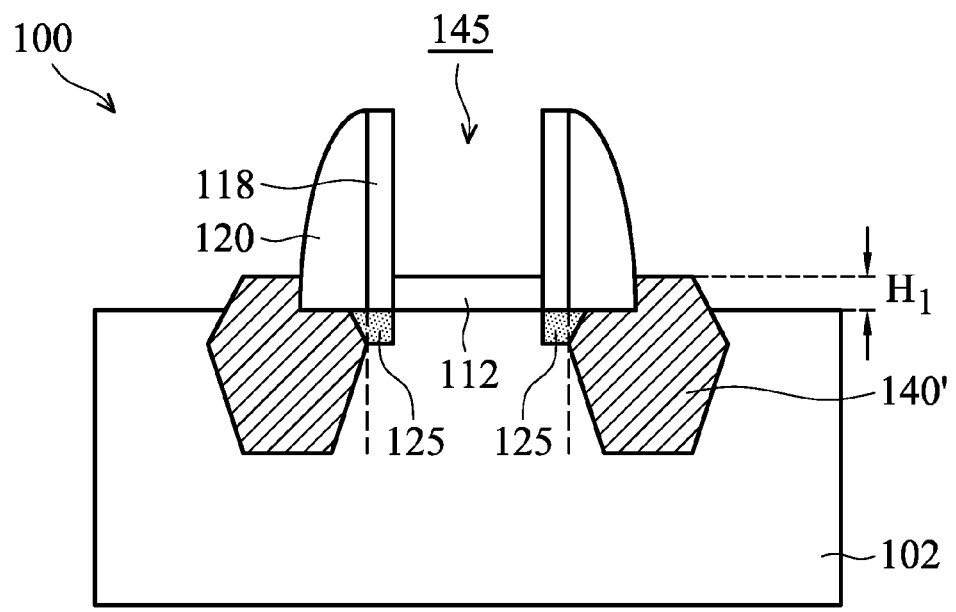

After forming SSD structure 140', gate dielectric layer 112 and gate electrode layer 114 are removed to form a trench 145 as shown in FIG. 2F in accordance with some embodiments of the disclosure. In some embodiments, gate dielectric layer 112 and gate electrode layer 114 are removed by an etching process.

Figure 2G:
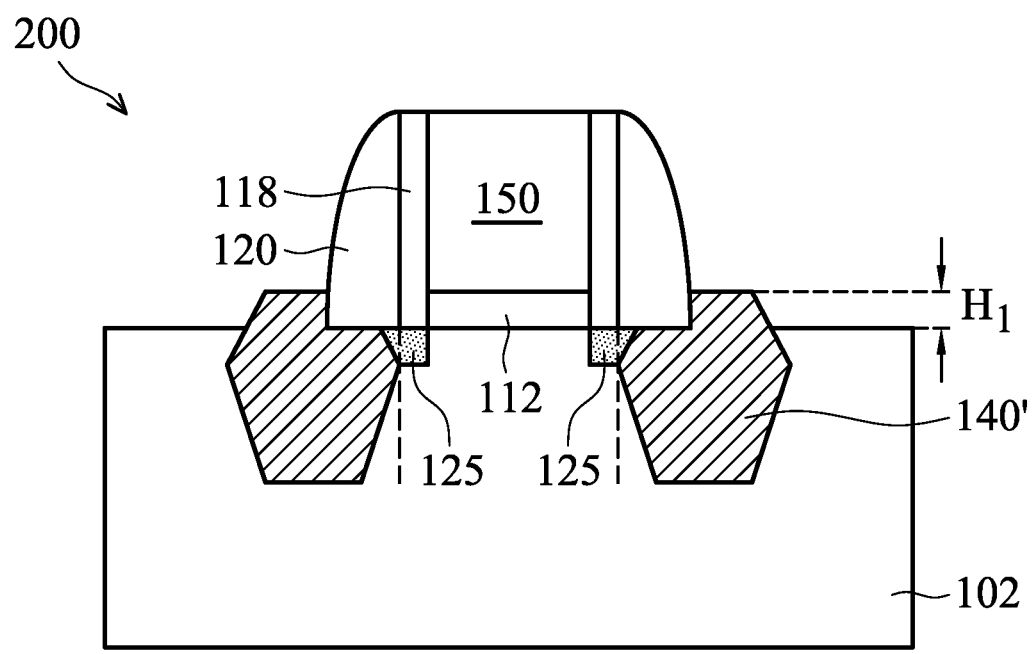

Afterwards, a metal gate electrode layer 150 is filled into trench 145 as shown in FIG. 2G in accordance with some embodiments of the disclosure. Additional processes may be performed to complete the fabricating steps of semiconductor device 100.

Embodiments of mechanisms of forming a semiconductor device are provided. Doped regions are formed in a substrate. A portion of the doped region is removed by a dry etching process and a wet etching process to form a recess. A surface proximity of the recess is controlled by design of the concentration of the doped region. The recess has a small surface proximity, and an SSD structure formed afterwards also has a small surface proximity. As a result, a channel length of a semiconductor device is reduced by shortening the surface proximity. Therefore, the performance of the semiconductor device is improved.

In some embodiments, a semiconductor device structure is provided. The semiconductor device structure includes a substrate and a gate stack structure formed on the substrate. The semiconductor device structure also includes gate spacers formed on sidewalls of the gate stacks. The semiconductor device structure includes doped regions formed in the substrate. The semiconductor device structure also includes a strained source and drain (SSD) structure adjacent to the gate spacers, and the doped regions are adjacent to the SSD structure. The semiconductor device structure includes SSD structure has a tip which is closest to the doped region, and the tip is substantially aligned with an inner side of gate spacers.

In some embodiments, a semiconductor device structure is provided. The semiconductor device structure includes a substrate having a top surface and a gate stack structure formed on the substrate. The semiconductor device structure includes sealing layers formed on sidewalls of the gate stack structure and gate spacers formed on the sealing layers. The semiconductor device structure also includes a doped region formed in the substrate below the gate spacers. The semiconductor device structure further includes an SiGe SSD structure formed in the substrate adjacent to gate spacers and the doped region, and a surface proximity is defined by a distance on the top surface of the substrate between an inner side of the gate spacers and an inner border of the SSD structure, and the surface proximity is in a range from about −1 nm to about +1 nm.

In some embodiments, a method for forming a semiconductor device structure is provided. The method includes providing a substrate having a top surface and forming a gate stack structure on the substrate. The method also includes forming sealing layers on sidewalls of the gate stack structure and forming gate spacers on the sealing layers. The method further includes forming a doped region in the substrate and performing a dry etching process to remove a portion of the doped regions and to form a recess in the substrate. The method includes performing a wet etching process to enlarge the recess to form an enlarged recess. The method also includes forming a strained source and drain (SSD) structure in the enlarged recess, and a surface proximity is defined by a distance on the top surface of the substrate between an inner side of the gate spacers and an inner border of the SSD structure, and the surface proximity is in a range from about −1 nm to about +1 nm.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device structure, comprising:
   a substrate;
   a gate stack structure formed on the substrate;
   gate spacers formed on sidewalls of the gate stack structure; and
   doped regions formed in the substrate;
   a source and drain (SSD) structure adjacent to the gate spacers, wherein the doped regions are adjacent to the SSD structure, and SSD structure has a tip which is closest to the doped region, and the tip is substantially aligned with an inner side of gate spacers, wherein the doped regions have a gradient dopant concentration, and dopant concentration is decreased from inner side to outer side of doped regions.

2. The semiconductor device structure as claimed in claim 1, wherein an inner border of the SSD structure on a top surface of substrate is not aligned with an outer side of the gate spacers.

3. The semiconductor device structure as claimed in claim 1, wherein the doped regions are doped with arsenic (As), phosphorous (P), antimony (Sb), boron (B) or boron fluorine ($BF_2$).

4. The semiconductor device structure as claimed in claim 1, wherein the doped regions have a depth in a range from about 1A to about 100A.

5. The semiconductor device structure as claimed in claim 1, wherein the doped regions have a doping concentration in a range from about 1E13 to about 2E18 atom/$cm^2$.

6. The semiconductor device structure as claimed in claim 1, wherein a surface proximity is defined by a distance on the substrate between the inner side of the gate spacers and an inner border of the SSD structure, and the surface proximity is in a range from about −1 nm to about +1 nm.

7. The semiconductor device structure as claimed in claim 1, wherein the SSD structure has a depth which is below a top surface of the substrate in a range from about 37 nm to about 43 nm.

8. The semiconductor device structure as claimed in claim 1, wherein the SSD structure has a raised height which is above a top surface of the substrate in a range from about 16 nm to about 20 nm.

9. The semiconductor device structure as claimed in claim 1, wherein the SSD structure comprises a silicon germanium (SiGe) SSD structure.

10. The semiconductor device structure as claimed in claim 1, wherein the SSD structure is defined by a first facet and a second facet of the substrate in a first direction and a third facet of the substrate in a second direction.

11. The semiconductor device structure as claimed in claim 10, wherein a tip depth between the top surface of the substrate and an intersection of the first facet and the second facet is in a range from about 5 nm to about 8 nm.

12. A semiconductor device structure, comprising:
a substrate having a top surface;
a gate stack structure formed on the substrate;
sealing layers formed on sidewalls of the gate stack structure;
gate spacers formed on the sealing layers;
a doped region formed in the substrate below the gate spacers; and
an SiGe SSD structure formed in the substrate adjacent to gate spacers and the doped region, wherein a surface proximity is defined by a distance on the top surface of the substrate between an inner side of the gate spacers and an inner border of the SiGe SSD structure, and the surface proximity is in a range from about −1 nm to about +1 nm, wherein the doped regions have a gradient dopant concentration, and dopant concentration is decreased from inner side to outer side of doped regions.

13. The semiconductor device structure as claimed in claim 12, wherein the doped regions are doped with arsenic (As), phosphorous (P), antimony (Sb), boron (B) or boron fluorine (BF$_2$).

14. The semiconductor device structure as claimed in claim 12, wherein the doped regions have a doping concentration in a range from about 1E13 to about 2E18 atom/cm$^2$.

15. The semiconductor device structure as claimed in claim 12, wherein the SiGe SSD structure has a raised height which is above the top surface of the substrate in a range from about 16 nm to about 20 nm.

16. The semiconductor device structure as claimed in claim 12, wherein the SiGe SSD structure is defined by a first facet and a second facet of the substrate in a first direction and a third facet of the substrate in a second direction.

17. The semiconductor device structure as claimed in claim 16, wherein a tip depth between the top surface of the substrate and an intersection of the first facet and the second facet is in a range from about 5 nm to about 8 nm.

18. The semiconductor device structure as claimed in claim 12, wherein an inner border of the SiGe SSD structure on a top surface of substrate is not aligned with an outer side of the gate spacers.

19. The semiconductor device structure as claimed in claim 12, wherein the SiGe SSD structure has a depth which is below a top surface of the substrate in a range from about 37 nm to about 43 nm.

20. The semiconductor device structure as claimed in claim 12, wherein SiGe SSD structure has a tip which is closest to the doped region, and the tip is substantially aligned with an inner side of gate spacers.

* * * * *